United States Patent [19]

Kuo et al.

[11] Patent Number: 5,561,615
[45] Date of Patent: Oct. 1, 1996

[54] METHOD AND APPARATUS FOR FLOATING POINT TO FIXED POINT CONVERSION WITH COMPENSATION FOR LOST PRECISION

[75] Inventors: Dong-Ying Kuo; Louise A. Koss, both of Ft. Collins, Colo.

[73] Assignee: Hewlett-Packard Company, Palo Alto, Calif.

[21] Appl. No.: 348,437

[22] Filed: Dec. 2, 1994

[51] Int. Cl.$^6$ .............................. G06F 7/00; G06F 15/00; G06F 7/38
[52] U.S. Cl. ...................... 364/715.03; 364/745; 364/748
[58] Field of Search ...................... 364/715.03, 715.04, 364/748, 748.5, 745, 736, 715.05

[56] References Cited

U.S. PATENT DOCUMENTS

| | | | |
|---|---|---|---|
| 4,631,696 | 12/1986 | Sakamoto | 364/715.03 |
| 5,161,117 | 11/1992 | Waggener, Jr. | 364/715.03 |
| 5,197,024 | 3/1993 | Pickett | 364/748.5 |
| 5,365,465 | 11/1994 | Larson | 364/715.03 |

*Primary Examiner*—Roy N. Envall, Jr.
*Assistant Examiner*—Emmanuel L. Moise
*Attorney, Agent, or Firm*—Edward L. Miller

[57] ABSTRACT

A floating point binary number that is to be converted to a fixed point representation, or a fixed point number to be reduced in precision, is originally located in a source register. A conversion mechanism connects the source register to a destination register. After the conversion the least significant bit of the fixed point representation may deliberately retain an indication of the existence of less significant non-zero bits that were truncated. When such retention is desired it is accomplished by forcing that least significant bit to be a one if the fractional portion of the converted number is zero and there were such truncated non-zero bits of lesser significance. To do this the direction and amount of mantissa shift needed during conversion are inspected to reveal which bit positions in the original floating point number are going to be truncated. An array of two-input AND gates has one AND gate per possible truncated bit. A mask is generated by a lookup table according to the number of bits to be truncated. The mask supplies a logic 1 to one input of each such corresponding gate; the other input of each gate is driven by the bit to be truncated. If any such bit to be truncated is a one, then the output of the corresponding gate will be true. The outputs of all these AND gates or OR'ed together and the result stored in a latch; a SET latch then indicates the impending truncation of at least one 1. After the conversion the fractional portion of the destination register is checked to see if it is all zeros. If it is, and if the latch is also SET, then the least significant bit of the fractional portion of the destination register is forced to be understood as a 1 when the register is read.

3 Claims, 1 Drawing Sheet

METHOD AND APPARATUS FOR FLOATING POINT TO FIXED POINT CONVERSION WITH COMPENSATION FOR LOST PRECISION

BACKGROUND OF THE INVENTION

It is well understood that the conversion of floating point numbers to fixed point involves a loss of precision. Nevertheless, it is still desirable for reasons of cost to perform certain tasks, such as the rendering of polygons in a graphics system, in fixed point. Unfortunately, the loss of precision (which can't be avoided) can sometimes introduce artifacts in the outcomes for the tasks being performed. Consider, for example, the graphics system task of area fill for a triangle described by three vertices. Let the sides be labeled one, two and three in order of their length. A collection of pixels can be identified to describe side one. Then sides one and two are considered together to find pixels for side two, which will include a vertex that is between sides two and three. Finally, sides one and three can be considered together to find pixels for side three. Those who are familiar with these kinds of processes will appreciate that two different descriptions can result for the one vertex formed by the intersection of sides two and three. They will further appreciate that the root cause is that some process, used over again for each side, but with different data each time, produces inconsistent results owing to the losses of precision in the floating point to fixed point conversions for the different instances of the process. This problem is most acute when the converted number appears to have a fractional portion of zero, when in fact the fractional portion would not be zero except for the truncation of bits during the conversion process. Mindful that the price of simply retaining all of the original precision is prohibitive, what is needed is a way to retain an indication, in the converted numbers themselves, that precision was lost. This indication can be used to counteract, or mitigate, the computational error or artifact that would otherwise occur.

Similar situations can arise, depending upon the circumstances, simply because there is a deliberate reduction in precision done without conversion from floating point to fixed point. Say, from forty-eight bits of fixed point down to thirty-two, or from thirty-two down to twenty-four or sixteen. It is the loss or precision that is the culprit, not, in principle, the conversion from one format to another. The compensatory technique to be described is applicable to both situations, although it is probable that the conversion situation is more prevalent than the other.

SUMMARY OF THE INVENTION

A floating point binary number that is to be converted to a fixed point representation in a fixed point register is originally located in a floating point register. A conversion mechanism connects the two registers. After the conversion the least significant bit of the fixed point representation may deliberately retain an indication of the existence of less significant non-zero bits that were truncated. When such retention is desired it is accomplished by forcing that least significant bit to be a one if the fractional portion of the converted number is zero and there were such truncated non-zero bits of lesser significance. To do this the direction and amount of mantissa shift needed during conversion are inspected to reveal which bit positions in the original floating point number are going to be truncated. An array of two-input AND gates has one AND gate per possible truncated bit. A mask is generated by a lookup table according to the number of bits to be truncated. The mask supplies a logic 1 to one input of each such corresponding gate; the other input of each gate is driven by the bit to be truncated. If any such bit to be truncated is a one, then the output of the corresponding gate will be true. The outputs of all these AND gates or OR'ed together and the result stored in a latch; a SET latch then indicates the impending truncation of at least one 1. After the conversion the fractional portion of the fixed point register is checked with a gate to see if it is all zeros. If it is, and if the latch is also SET, then the least significant bit of the fractional portion of the fixed point register is forced to be understood as a 1 when the register is read.

In the case where a fixed point number is simply to be truncated it is not necessary to inspect an exponent, as presumably it is already known which bits are going to be truncated.

DESCRIPTION OF A PREFERRED EMBODIMENT

Figure 1:
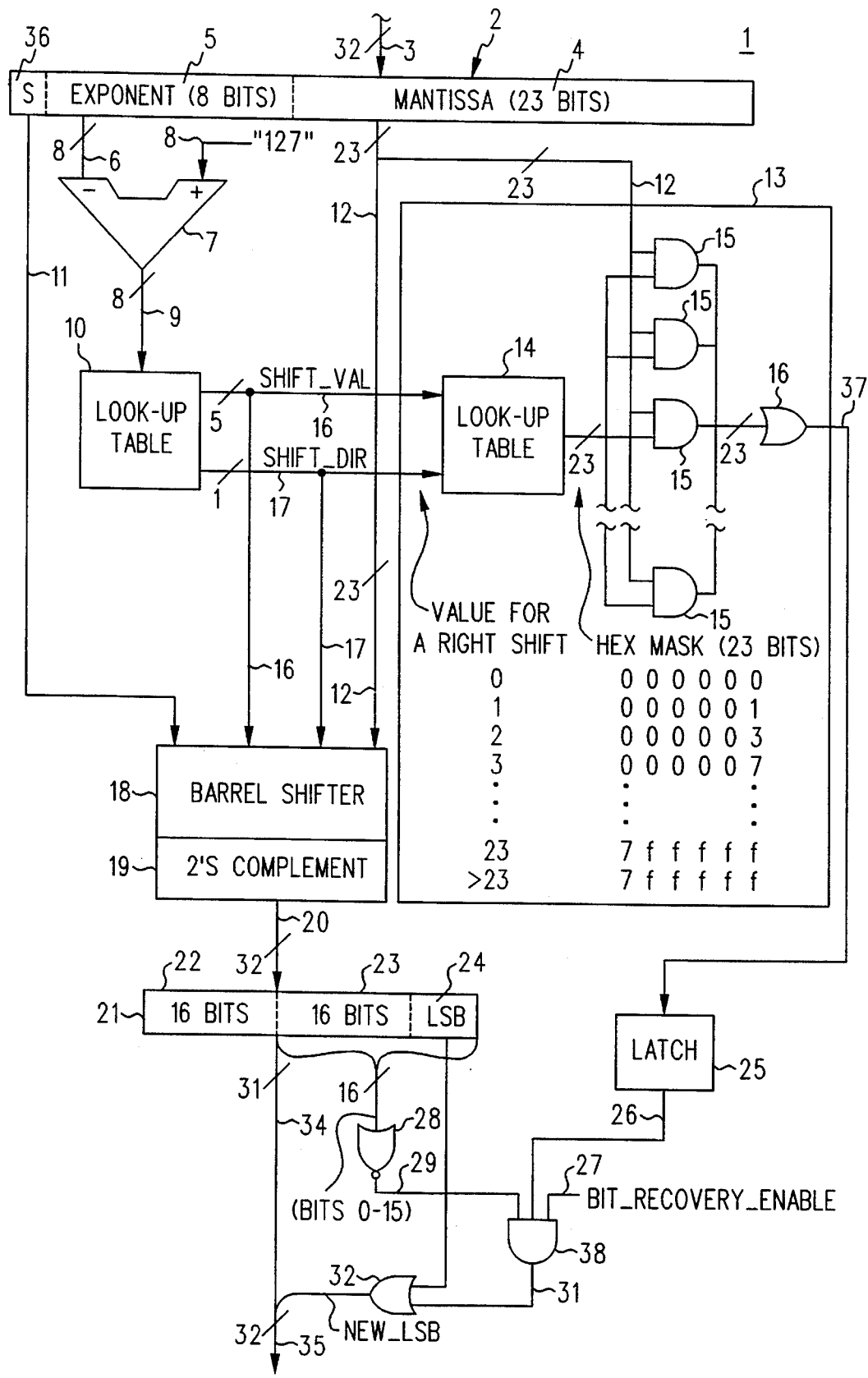
FIG. 1 is a simplified block diagram of a circuit arrangement for converting a floating point number into a fixed point representation while optionally retaining an indication in the LSB that there was at least one 1 in the bits that were truncated as part of the conversion.

Refer now to FIG. 1, wherein is shown a simplified block diagram of a hardware mechanism 1 constructed in accordance with the teachings of the invention and that converts floating point numbers to fixed point numbers while optionally retaining an indication of truncated 1's. A floating point register 2 receives a thirty-two bit floating point number from some source (not shown) over path 3. The format of the number and register 2 may be that described by ANSI/IEEE standard 754–1985, which is what is shown in the figure.

A twenty-three bit mantissa portion (bits 0–22) occupies the least significant portion 4 of floating point register 2. Next is an eight bit field 5 of exponent information (offset in value by one hundred and twenty-seven, in accordance with the ANSI/IEEE standard), which leaves a one-bit sign field 36 that describes the sign of the mantissa portion 4.

To accomplish the conversion to a fixed point representation stored in fixed point register 21, the eight-bit exponent value 6 in field 5 of floating point register 2 is coupled to a subtraction circuit 7 whose other input 8 has a numeric value of one hundred and twenty-seven. This removes the offset in the exponent value 6, and produces a true eight-bit exponent value 9 that is in turn coupled as an input to a look-up table 10. The output of the look-up table 10 is composed of two fields: five bits of shift_val 5 that describe the number of shifts that the mantissa portion 4 must be shifted before it is placed into the fixed point register 21; and, one bit of shift_dir 17 that describes which direction the mantissa is to be shifted. These two values 16 and 17 are sent two places: to a barrel shifter 18 that actually shifts the twenty-three bits 12 of the mantissa 4 by the correct amount in the proper direction; and, to a look-up table 14 whose task it is to generate a mask that identifies the bits in the mantissa 4 that are to be checked as part of the retention mechanism for lost precision.

Look-up table 14 is part of a circuit 13 that determines if the conditions exist that require compensation for lost precision. If they do a signal is produced on output 37, which is subsequently used to produce such compensation, provided that the compensatory mode of operation has been enabled. To accomplish this task look-up table 14 produces in a twenty-three bit wide field a bit pattern of consecutive 1's corresponding to those bits in the mantissa portion 4 that will be right-shifted beyond the LSB 24 of the fixed point register 21, and that are thus lost owing to truncation. This collection of bit patterns is produced only for fight shifts, has one more bit in the consecutive 1's thereof for each increasing value of shift_val 16, and is applied to a collection of AND gates 15. There is one AND gate 15 for each of the twenty-three bit positions in mantissa portion 4. Those twenty-three bits 12 are coupled to the AND gates 15. Each bit is one input to an associated two-input AND gate. The other input is the corresponding bit in the twenty-three bit field from the look-up table 14. If an output of any of the AND gates 15 is true it signifies that the portion of the mantissa 4 about to be truncated contains a 1. The OR of all the possible twenty-three truncated positions is formed by OR gate 16, whose output is the aforementioned signal 37.

Meanwhile, the barrel shifter 18 and a 2's complement circuit 19 have been receiving the value 11 of the sign bit 36, the values shift_val 16 and shift_dir 17, and the mantissa value 12. The output from these is a thirty-two bit 2's complement fixed point value 20 that is captured in fixed point register 21. The fixed point value 20 is assumed to have a binary point between an integer portion 22 of sixteen bits and a fractional portion 23 that is also of sixteen bits.

The output 37 from circuit 13 is captured in a latch 25. Its output 26 is applied to an AND gate 38 that has two other inputs: a signal bit_recovery_enable 27 that is true if the compensatory mode of operation is desired, and false if not; and, a signal 29 that is the output from an NOR gate 28 whose inputs are the fractional portion 23 of the fixed point value in fixed point register 21. Signal 29 is true whenever the sixteen least significant bits 24 are all 0's. This is one of the conditions needed to invoke the compensation. Thus, if all three signals 26, 27 and 29 are true, the compensation should be performed, which is then indicated by signal 31 being true.

The compensation is performed by OR gate 32. It has two inputs: the very LSB 24 of the fractional portion 23 of the fixed point number in fixed point register 21; and, signal 31. The output 33 of OR gate 32 is a signal NEW_LSB that is taken in place of the original LSB 24. By virtue of the way the OR gate 32 works, if signal 31 is true the value of NEW_LSB is a 1, regardless of what the original LSB 24 is. This is the forced retention of an indication of non-zero significance that has been lost by truncation. On the other hand, if signal 31 is a 0 (false), then the value of NEW_LSB 33 is the same as the original LSB 24.

To complete the explanation of FIG. 1, note that the collection 34 of bits 1–31 of fixed point register 21 are combined with NEW_LSB 33 to produce the thirty-two bit output 35 that may then be used by subsequent processing mechanisms.

Finally, the following observations will be appreciated in connection with FIG. 1. First, the particular formats shown are not essential, and are merely illustrative. Next, it will be understood that if the fractional portion of a fixed point number were being truncated, then an exponent inspection is unneeded, and the mask bits generated by the look-up table 14 would correspond to the number of bits being truncated. This could also mean that the barrel shifter 18 would be absent, particularly if the reduction in precision were fixed and achieved by simply not coupling the least significant bits of the source register into the destination register. The 2's complement circuit 19 would be present, or not, as makes sense for the task at hand.

We claim:

1. A method of compensating lost precision for a truncated binary number stored in a register having a fewer number of bits than the original untruncated binary number, the method comprising the steps of:

(a) determining if any Of the bits to be truncated to reduce the precision of the binary number are 1's;

(b) truncating the original binary number to reduce its precision;

(c) storing the truncated binary number in a fixed point format having a fractional portion; and (d) altering the least significant bit of the truncated binary number to be a 1 if the fractional portion of the truncated binary number is all 0's and the determination in step (a) was in the affirmative.

2. A method of converting a floating point binary number having an exponent and a mantissa to a fixed point number that includes a fractional portion, the method comprising the steps of:

(a) inspecting the exponent to determine the direction and number of bits to shift the mantissa of the floating point binary number to align it with the bit positions of a fixed point destination;

(b) inspecting those bits of the mantissa that will be lost by truncation to determine if any of those bits are 1's;

(c) storing the shifted version of the mantissa as a fixed point binary number that includes a fractional portion;

(d) inspecting the bits of the fractional portion to determine if they are all 0's;

(e) altering the least significant bit of the fixed point binary number to be a 1 if the fractional portion is all 0's and the determination in step (b) was in the affirmative.

3. A circuit for compensating a binary fixed point representation of a binary floating point number for precision lost in a conversion from floating point to fixed point, the circuit comprising:

a first register containing a binary floating point number including an exponent and a mantissa;

a first circuit, coupled to the exponent, that produces a shift signal that indicates the direction and number of shifts that the mantissa is to be shifted as part of its conversion to a binary fixed point representation that includes a fractional part;

a shift circuit having a first input coupled to the mantissa contained in the first register, a second input coupled to the shift signal, and an output at which appears a bit pattern at the first input after being shifted in the direction and the amount indicted by the shift signal:

a second register, coupled to the output of the shifting circuit, that receives a binary fixed point representation of the binary floating point number in the first register;

a second circuit, coupled to the mantissa contained in the first register and to the shift signal, that produces a loss signal that indicates if any of the bits in that mantissa that are not represented in the second register, owing to truncation, were 1—s;

a third circuit, coupled to the bits in the second register representing the fractional part of the binary fixed point number, that produces an output signal indicative that the fractional part is all zeros; and a fourth circuit, coupled to the least significant bit of the fractional part contained in the second register, to the output from the third circuit and to the loss signal, that represents the least significant bit of the fractional part as a 1 when the output from the third circuit indicates that the fractional part is all 0—s and the loss signal indicates that at least one 1 was truncated, and that at other times indicates the least significant bit of the fractional part as it actually is in the second register.

* * * * *